United States Patent
Mantey et al.

(10) Patent No.: US 6,901,344 B2
(45) Date of Patent: May 31, 2005

(54) APPARATUS AND METHOD FOR VERIFICATION OF SYSTEM INTERCONNECT UPON HOT-PLUGGING OF ELECTRONIC FIELD REPLACEABLE UNITS

(75) Inventors: Paul John Mantey, Ft. Collins, CO (US); Mike J. Erickson, Loveland, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 88 days.

(21) Appl. No.: 10/364,858

(22) Filed: Feb. 11, 2003

(65) Prior Publication Data

US 2004/0158424 A1 Aug. 12, 2004

(51) Int. Cl.[7] .............................................. G06F 19/00
(52) U.S. Cl. ...................................... 702/122; 324/765
(58) Field of Search .......................... 702/122, 34, 58, 702/59, 118, 183–185; 324/765; 714/25, 30, 31

(56) References Cited

U.S. PATENT DOCUMENTS

| | | | | |
|---|---|---|---|---|
| 4,285,233 A | * | 8/1981 | Swis | 73/116 |
| RE31,728 E | * | 11/1984 | Simmonds | 179/175.3 |
| 4,794,599 A | * | 12/1988 | Purcell et al. | 714/719 |
| 5,572,141 A | | 11/1996 | Hutton | |
| 5,617,430 A | * | 4/1997 | Angelotti et al. | 714/726 |
| 5,791,934 A | * | 8/1998 | Hatley et al. | 439/482 |
| 6,058,255 A | * | 5/2000 | Jordan | 716/4 |
| 6,674,297 B1 | * | 1/2004 | Florence et al. | 324/761 |
| 6,725,404 B1 | * | 4/2004 | Choudhury et al. | 714/724 |

FOREIGN PATENT DOCUMENTS

EP    1041491    10/2000

* cited by examiner

Primary Examiner—Marc S. Hoff
Assistant Examiner—Edward Raymond

(57) ABSTRACT

A field unit has a connector with first and second interconnect apparatus coupled to connector. The field replaceable unit has test apparatus coupled to the first and second interconnect apparatus capable of testing connections through the connector to the first interconnect apparatus under control of signals on the second interconnect apparatus. The field replaceable unit is capable of being hot-plugged. In an embodiment, the second interconnect apparatus is of the JTAG type. Also claimed is a method of testing interconnect between the field replaceable unit and another unit of a system into which it has been hot-plugged.

7 Claims, 4 Drawing Sheets

APPARATUS AND METHOD FOR VERIFICATION OF SYSTEM INTERCONNECT UPON HOT-PLUGGING OF ELECTRONIC FIELD REPLACEABLE UNITS

FIELD OF THE APPLICATION

The application relates to the field of self-test of electronic systems, including computer systems, having hot-pluggable field-replaceable units. In particular, the application relates to methods for verifying functionality and correct connection of high-speed interconnect apparatus of the field replaceable units. Disclosed embodiments relate specifically to self-test of hot-pluggable field replaceable units in high performance and high reliability computing systems.

BACKGROUND OF THE APPLICATION

Field Replaceable Units

Many electronic systems, including most computer systems, contain multiple field replaceable units (FRUs). FRUs generally include any portion of an electronic system that is designed to be replaced without requiring transport of the entire system to a repair facility. FRUs include input/output cards and processor modules, including PCI bus cards, of computer systems. FRUs also include channel interface cards of telephone switching and other communications systems.

As with anything else built by man, electronic circuitry can fail. Electronic systems, including computers, are often repaired by replacing one or more FRUs. FRUs may also be added to a system, or exchanged with others in a system, to reconfigure or expand the system to meet particular system requirements.

Hot Plugging

It is often undesirable to completely shut down an electronic system for maintenance, even when maintenance requires replacement of, or addition of, one or more FRUs. For example, it is undesirable to shut down a telephone switching machine serving ten thousand customers so that a trunk interface card can be replaced. Similarly, it is undesirable to shut down an entire airline reservation-tracking computer system for minor repairs and reconfiguration. Many electronic communications and computing systems therefore allow hot-plugging (also known as hot-socketing) of FRUs to minimize the need for system shutdowns during repair and reconfiguration.

An example hot-pluggable FRU is a PCMCIA expansion card such as are commonly used with notebook computers. PCMCIA cards have a connector supporting moderately high-speed digital interconnect in the form of a parallel digital bus, as well as power, control, and reset connections.

High Speed Interconnect

Many FRUs of modem communications and computing systems have connectors supporting one or more high-speed digital interconnect systems. These high speed interconnect systems typically involve one or more parallel busses, such as the PCI or PCMCIA busses, allowing for two, three or more connections. Many other bus types are also known. High speed interconnect may also be point-to-point interconnect having two connections.

FRUs may incorporate processors and/or memory. They may also incorporate input-output (IO) devices such as network interfaces, disk drives, disk drive controllers, display and keyboard adapters, power supplies, and many other components of communications and computing systems.

Designs are known for systems wherein at least some FRUs can be exchanged while other components of the system continue operation. For example, many RAID (Redundant Array of Independent Disks) array systems provide for replacement of failed drives and reconstruction of datasets without requiring system shutdown. These systems often provide mechanisms for sequencing power and reset connections to an FRU. These designs also often provide mechanisms for self testing each FRU after it is inserted into a system.

JTAG

The IEEE 1149.1 serial bus, also known as the JTAG bus, was devised for testing of inactive FRUs by providing access from a tester to circuitry within the FRU. In particular, the JTAG bus provided ability to perform a boundary scan on each integrated circuit on an FRU. The tester can verify connectivity of the integrated circuits of an FRU and verify that they are installed correctly. The JTAG bus provides for interconnection of one or more integrated circuits in a chain, any of which may be addressed by the tester. Typically, multiple devices of a circuit board are interconnected into a JTAG chain.

The JTAG bus uses four wires. These include a serial data-in line, a serial data-out line, a clock line, and a test mode select line. Typically the data-out line of a first chip in a chain couples in daisy-chain configuration to the data-in line of a second chip of the chain, and the data-out line of the second chip couples to the data-in line of a third; the data-out line of the last chip in the chain is brought back to the test connector.

The IEEE 1152 bus is a newer, enhanced, version of the 1149.1 JTAG bus. References herein to a JTAG bus are intended to include both the 1149.1 and 1152 variations.

The JTAG bus is most often used for testing an FRU in a factory environment, typically when these FRU's are inserted into FRU test apparatus for production testing. For purposes of this application, the term system excludes FRU test apparatus as used in production testing; the term system includes computer systems where FRUs operate to run operating system and user programs.

Installation of FRUs

When FRUs are inserted into a system, it is possible that some wires of connectors may make proper contact with circuitry of the FRU while other wires may not couple correctly—they may be resistive or remain open. This is particularly likely if the connectors are dirty, or if circuit boards of the system and FRU flex during insertion. If the connections coupling the FRU to other parts of the system can be tested for resistive and open wires, an installer could repair the installation by cleaning the connectors and reseating the FRU.

Newly installed FRUs may also have cold solder joints or electrostatic discharge (ESD) damage that can also impair communications over connections coupling the FRU to other parts of the system. While cold solder joints and ESD damage can not be repaired by cleaning connectors, it is desirable to identify FRUs having these faults and avoid using them in systems.

In modern high performance systems, error correcting coding (ECC) may be used on some high speed interconnect, including high speed interconnect crossing connections between an FRU and remaining parts of the system. ECC can, however, mask the effect of resistive or open wires of connectors coupling an FRU to remaining parts of the system. This masking occurs because the ECC makes the system appear to work correctly even with resistive or open wires. It is desirable to identify resistive and open wires of connectors protected by ECC since resistive and open wires can cause other faults, normally correctable through ECC, to be uncorrectable; thereby degrading system reliability It is therefore desirable to test connections between an FRU and remaining parts of a system upon installation or replacement of an FRU.

SUMMARY OF THE APPLICATION

An FRU having high speed interconnect is equipped with a test-access path. In a particular embodiment the test-access path is a JTAG-compliant scan path.

Upon insertion of an FRU into the system, power and reset signals are applied to the FRU. A processor of the system then uses the test-access path of the FRU to test high-speed interconnect paths across connectors coupling the FRU to the system. In a particular embodiment, the high-speed interconnect are protected by ECC; ECC syndrome lines are tested separately and interconnect data lines are tested with ECC disabled.

Any problems detected with the high-speed interconnect paths are reported to the installer. The installer may then correct the problem by re-seating the FRU in its connectors, or replacing the FRU.

Once the high-speed interconnect has been tested, reset signals applied to the FRU are released.

In a particular embodiment, the processor of the system that uses the test-access path is a system management processor of the system.

In a particular embodiment, a high-speed interconnect stimulator is provided for testing the high speed interconnect and its connection to the newly inserted FRU. In an alternative embodiment, a scan path of a second FRU already installed in the system is used to test the high speed interconnect and its connection to the newly inserted FRU.

DETAILED DESCRIPTION OF THE EMBODIMENTS

Figure 1:
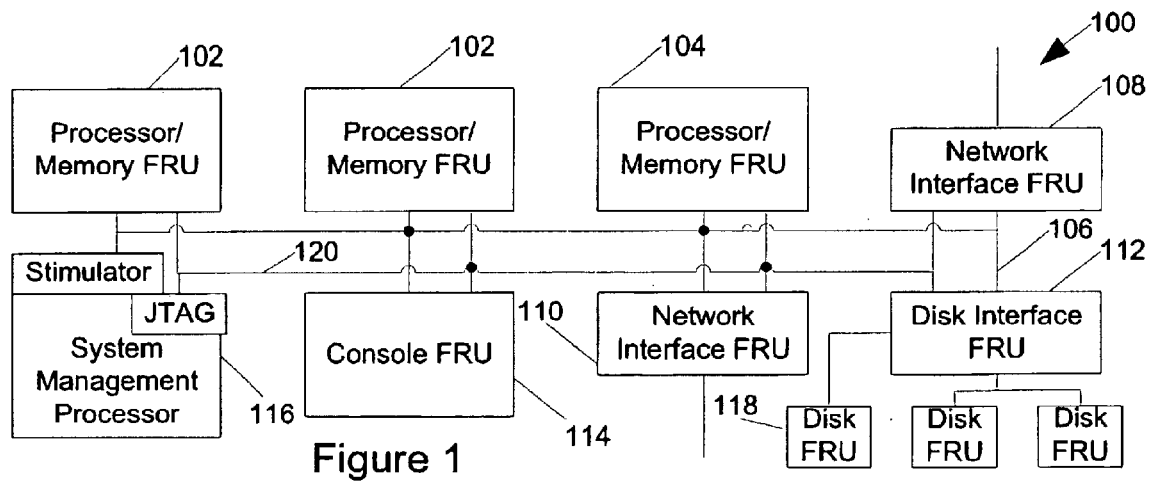
FIG. 1 is a block diagram of a computing system having multiple FRUs.

A computer system 100 such as is illustrated in FIG. 1 has at least one processor-memory FRUs 102, 104, interconnected by high-speed interconnect 106. High-speed interconnect 106 is also connected to one or more network interface FRUs 108, 110, one or more disk interface FRUs 112, and a console FRU 114. There is also a system management processor 116 intended to perform system management functions while not executing production software. Disk interface FRUs 112 are coupled to one or more disk drive FRUs 118.

System management processor 116 is coupled through a test interconnect 120 to the processor-memory FRUs 102, 104, network interface FRUs 108, 110, disk interface FRUs 112, and console FRU 114. In a particular embodiment, test interconnect 120 incorporates JTAG scan chains. System management processor 116 is also coupled through an interconnect stimulator 122 to high speed interconnect 106

In normal operation, the processor/memory FRUs 102, 104, communicate with each other, the network interface FRUs 108, 110, disk interface FRU 112, and console FRU 114, over the high speed interconnect 106.

Figure 2:
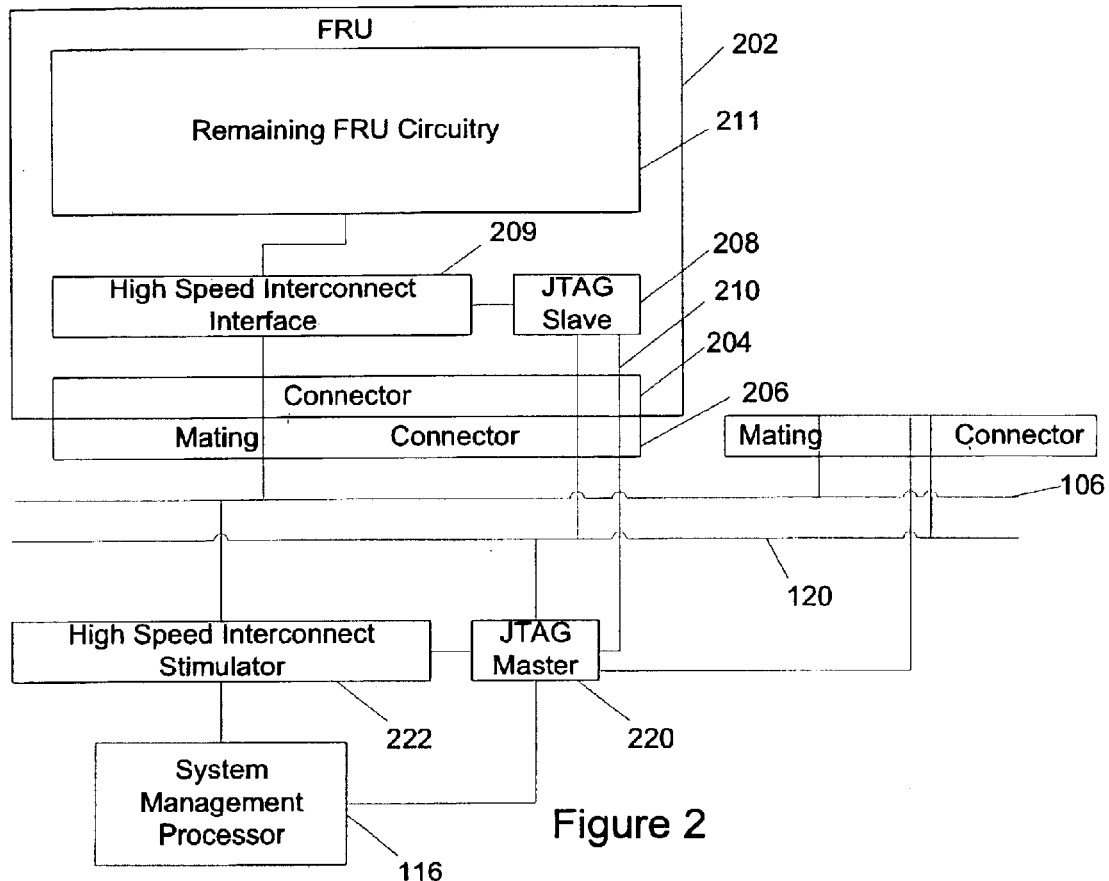
FIG. 2 is a block diagram of a generic FRU inserted in a connector of a system, showing test circuitry of the FRU and system.

FIG. 2 illustrates a generic FRU 202, which may be a processor/memory FRU 102, 104, network interface FRU 108, 110, disk interface FRU 112, a console FRU 114, or another FRU of system 100 capable of connecting to high-speed interconnect 106 and for which hot plug capability is desired.

Generic FRU 202 has a connector 204 whereby it may be attached to a mating connector 206 or 207 of system 100. In a particular embodiment, connector 204 is an edge connector, in another embodiment connector 204 is a multiple-pin PCMCIA connector. It is anticipated that connector 204 may be of additional types. In the particular embodiment, connector 204 is designed such that, as the FRU 202 is inserted into the mating connector 206, power, ground, and reset lines of connector 204 couple to corresponding wires of the mating connector before high speed interconnect 106 lines of connector 204.

Generic FRU 202 has a test interconnect interface in the form of JTAG slave interface 208, controlled by JTAG signals 210 of test interconnect 120. These JTAG signals 210 are brought to connector 204 such that JTAG slave interface 208 is capable of coupling to test interconnect 120 through the mating connector 206.

Generic FRU 202 has high-speed interconnect interface 209 coupled to JTAG slave interface 208. During normal operation, high speed interconnect interface 209 provides apparatus for remaining circuitry 211 of the FRU to communicate over high speed interconnect 106. The high-speed interconnect interface 209 incorporates test apparatus such that JTAG slave interface 208 is capable of reading signals received by high-speed interconnect interface 209 from high speed interconnect 106, and of causing high-speed interconnect interface 209 to arbitrate for and place signals on high speed interconnect 106.

The system management processor 116 has a multiple-channel JTAG master 220 such that each mating connector 206 of the system is coupled to a separate channel of the JTAG master 220. System management processor 116 also has a stimulator 222 capable of placing predetermined patterns of signals on high speed interconnect 106.

Figure 3:
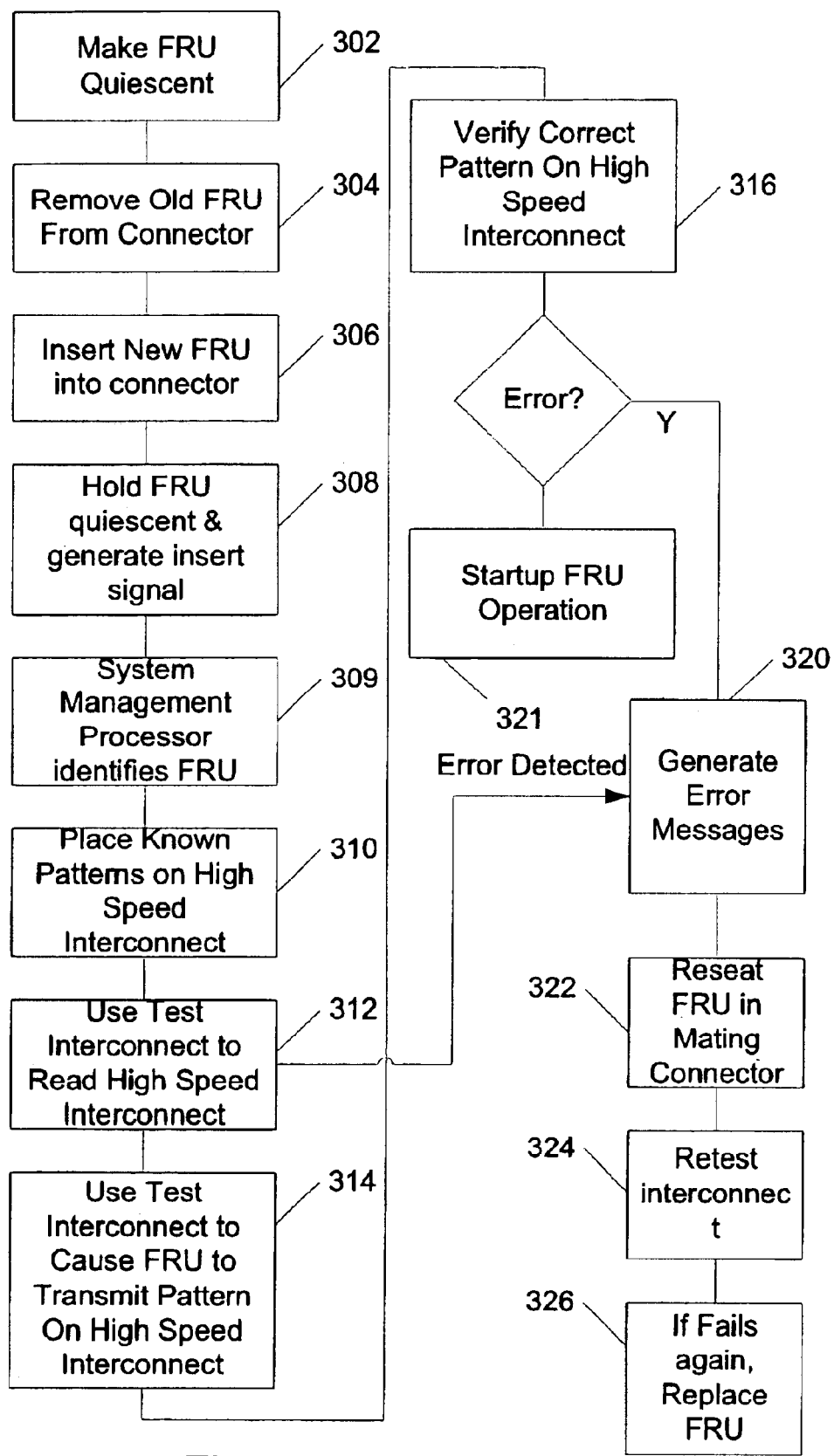
FIG. 3 is a flowchart illustrating insertion of, and testing interconnect paths coupled to, an FRU.

When it is desired to replace an old FRU, which may be a defective or obsolete FRU of system 100, such as processor/memory FRU 104 or network interface FRU 110, the FRU is rendered quiescent 302 (FIG. 3) through commands entered on system console 114. In the particular embodiment, rendering the FRU quiescent is done without shutting down system 100. The old FRU is then removed 304 from mating connector 206 of system 100.

Next, a new FRU, which may be a replacement, an upgraded, or an additional FRU, is inserted 306 such that its connector 204 engages with mating connector 206 of system 100. The new FRU is held quiescent while an FRU-insertion signal is generated 308. The system management processor 116 then interrogates the FRU to identify 309 the FRUs type.

The system management processor 116, acting through high speed interconnect stimulator 222, then arbitrates for high-speed interconnect 106 and places 310 known patterns thereon. When placing known patterns 310 on high-speed interconnect 106, ECC features are disabled so that all lines may be tested. The system management processor then uses test interconnect 120 to read 312 the high speed interconnect interface 204 of the FRU 202 and verify correct receipt of the known patterns. This sequence verifies that the FRU is capable of receiving patterns from the high-speed interconnect correctly.

Next, system management processor 116 uses test interconnect 120 to cause 314 the high speed interconnect interface 204 of FRU 202 to arbitrate for, and place known patterns on, high speed interconnect 106. The system management processor 116 then reads 316 the known patterns from the high speed interconnect 106 and verifies that they are correct. This sequence verifies that the FRU can transmit patterns correctly on the high speed interconnect. If any error is detected during reading of patterns 312 or verifying patterns 316, an error message is generated 320; otherwise the FRU is started 321 by releasing its reset signals.

Should an error have been detected and an error message generated 320, an installer may reseat 322 the FRU in the mating connector 206. If this is done, the high-speed interconnect to the FRU is retested 324 by repeating the steps of holding the FRU quiescent 308, identifying the FRU type 309, placing known patterns 310 on the interconnect, reading and verifying 312 the patterns, transmitting 314 patterns from the FRU, and verifying 316 the patterns. If the retest passes, the FRU is started by releasing its reset signals, if not the installer may replace 326 the FRU.

Figure 4:
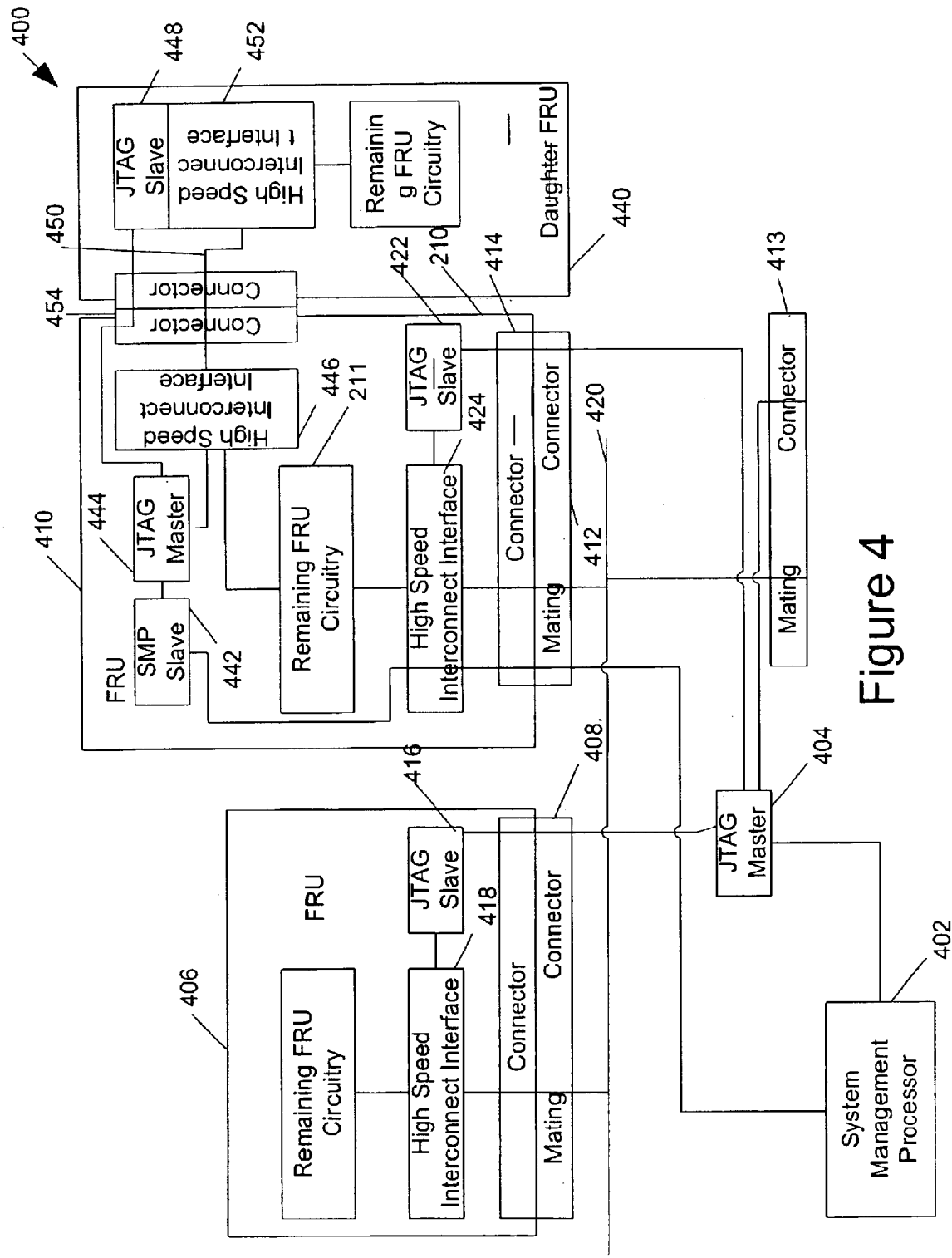
FIG. 4 is a block diagram of an alternative embodiment of a newly inserted generic FRU in a connector of a system, where a scan path and high-speed interconnect interface of an FRU already installed in the system is used for testing newly inserted FRUs.

In an alternative embodiment, illustrated in FIG. 4, the high speed interconnect stimulator 222 of the embodiment illustrated in FIG. 2 is not needed. In a system 400 of this embodiment, system management processor 402 communicates with a JTAG master 404, and a first FRU 406 is installed in a mating connector 408 in the system 400.

When a new FRU 410, which may be a replacement, an upgraded, or an additional FRU, is inserted 306 into a mating connector 412 of the system such that its connector 414 engages with mating connector 412. The new FRU is held quiescent 308 while an FRU-insertion signal is generated 308. System management processor 402 then interrogates the FRU to identify 309 the FRUs type.

The system management processor 402 then selects an FRU 406 already present in the system 400 and capable of communicating with newly installed FRU 410. There may, but need not, be additional FRUs in additional mating connectors 413 in the system; these additional FRUs may but need not be capable of communicating over the same high speed interconnect 420 as that used for communications between the already present FRU 406 and the newly installed FRU 410. System management processor 402 then communicates with a JTAG slave 416 of FRU 406 to instruct high speed interconnect interface 418 of FRU 406 to briefly interrupt its operation by arbitrating for, and placing 310 known patterns on, high speed interconnect 420. As when placing known patterns 310 on high-speed interconnect 420, ECC features are disabled so that all lines may be tested. The system management processor then uses JTAG slave 422 of the newly inserted FRU 410 to read 312 the high speed interconnect interface 424 of FRU 410 and verify correct receipt of the known patterns. This sequence verifies that the FRU is capable of receiving patterns from the high-speed interconnect correctly.

Next, system management processor 402 uses JTAG master 404 to communicate through JTAG slave 422 to the high speed interconnect interface 424 of FRU 410. Management processor 402 commands high speed interconnect interface 424 to arbitrate for, and place known patterns on, high speed interconnect 420. These known patterns are addressed to, and received by, high speed interconnect interface 418 of the earlier installed FRU 406. The system management processor 402 then reads 316, through JTAG slave 416 and JTAG master 404, the known patterns from the high speed interconnect interface 418 of the earlier installed FRU 406 and verifies that they are correct. This sequence verifies that the FRU can transmit patterns correctly on the high speed interconnect.

If any error is detected during reading of patterns 312 or verifying patterns 316, an error message is generated 320; otherwise the FRU is started 321 by releasing its reset signals.

It is anticipated that the sequence of verifying that the newly inserted FRU 410 is capable of receiving known patterns correctly (310–312) and transmitting known patterns correctly (314–316) can be reversed without departing from the spirit of the invention. In an alternative embodiment, correct transmission is verified before correct reception is verified.

Figure 5:
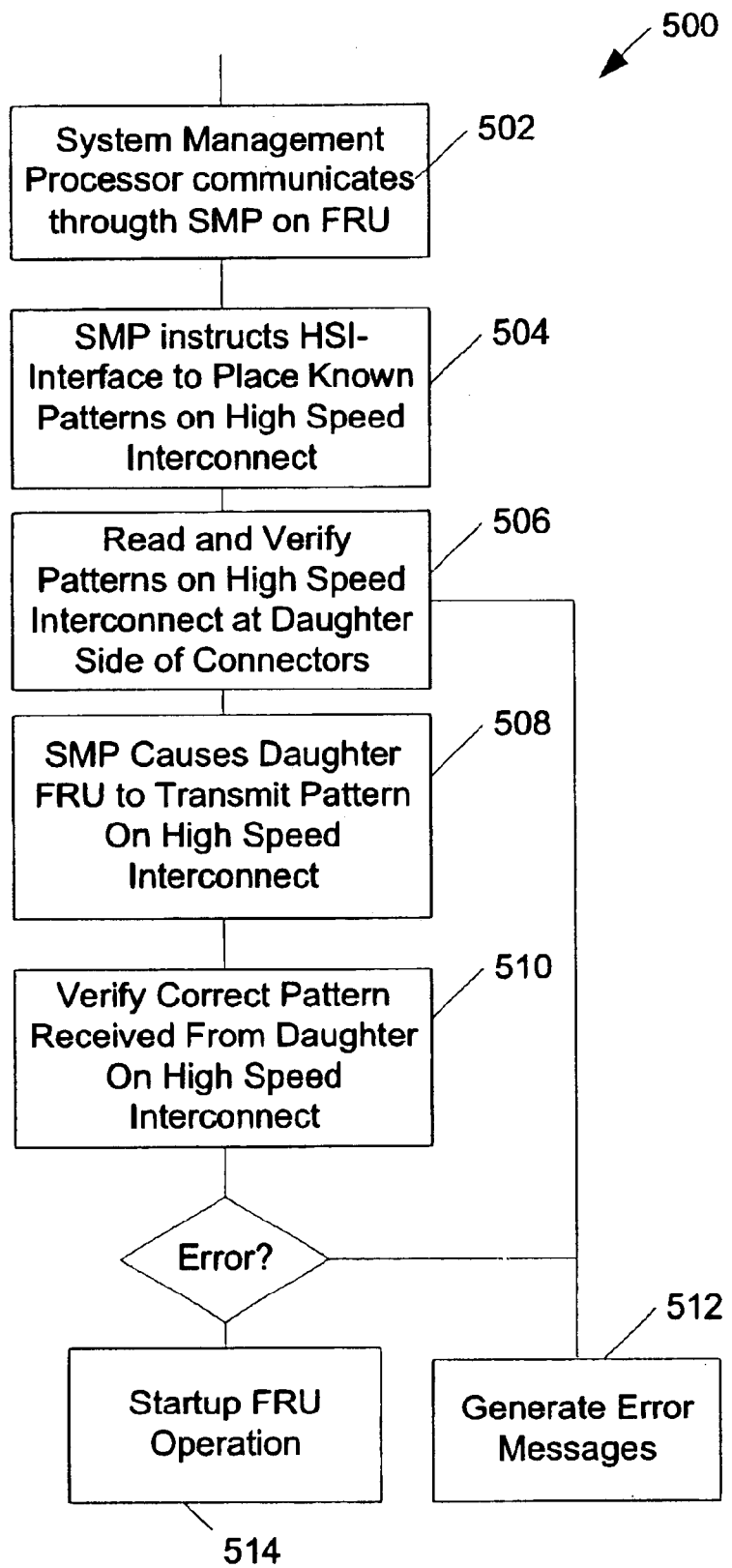
FIG. 5 is a flowchart illustrating additional steps associated with insertion of, and testing interconnect paths coupled to, a daughter FRU.

The method is applicable to point-to-point high-speed interconnect as well as to multidrop bussing. The method is also applicable to FRUs, such as FRU 410, that have daughter FRUs, such as daughter FRU 440. When an FRU 410 having a daughter FRU 440 is inserted into the system, the system management processor 402 identifies 309 and tests 309–316 the ability of FRU 410 to communicate with other parts of the system 400 as heretofore described. Should testing fail, error messages are generated 320 as heretofore described. Should testing succeed, testing 500 (FIG. 5) of FRU 410 to daughter FRU 440 communication is performed before the FRU is started 321.

In an embodiment, testing 500 (FIG. 5) of FRU 410 to daughter FRU 440 communication is performed by system management processor 402 through a slave system management processor (SMP) 442 on FRU 410, which communicates with a JTAG master 444 on FRU 410. In an alternative embodiment, system management processor 402 communicates directly with JTAG master 444.

Under control of the system management processor 402, the SMP instructs 504 FRU 410's daughter-connector high speed interconnect interface 446 to place known patterns on high speed interconnect 450. High speed interconnect 450 is that used during normal operation for communications between FRU 410 and daughter FRU 440. The SMP then uses a JTAG slave port 448 of a high-speed interconnect interface 452 to read and verify 506 the known patterns as received by the high-speed interconnect interface 452 on the daughter FRU 440 side of the daughter FRU connector 454.

Under control of the system management processor 402, the SMP 442 then causes 508 daughter FRU 440's high speed interconnect interface 452 to place known patterns on high speed interconnect 450. The SMP then uses high-speed interconnect interface 446 to read and verify 510 the known patterns as received on the FRU 410 side of connector 454.

Should any error be detected during the either step of read and verify 506, 510, appropriate error messages are generated 512. If no error is detected, operation of both daughter FRU 440 and FRU 410 is started 514 by releasing their reset signals.

While the forgoing has been particularly shown and described with reference to particular embodiments thereof, it will be understood by those skilled in the art that various other changes in the form and details may be made without departing from the spirit and hereof. It is to be understood that various changes may be made in adapting the description to different embodiments without departing from the broader concepts disclosed herein and comprehended by the claims that foll

What is claimed is:

1. A method of testing interconnect between a first field replaceable unit and a second unit of a system comprising the steps of:

inserting the first field replaceable unit into a connector of the system, the first field replaceable unit having a high speed interconnect interface and a test interconnect;

detecting insertion of the first field replaceable unit;

verifying an ability of the first field replaceable unit to receive signals from a second unit of the system through its high speed interconnect interface; and verifying an ability of the first field replaceable unit to transmit signals to the second unit of the system through its high speed interconnect interface.

2. The method of claim 1, wherein the steps of verifying an ability of the first field replaceable unit to receive signals from the second unit of the system through its high speed interconnect interface and verifying an ability of the first field replaceable unit to transmit signals to the second unit of the system are performed through a JTAG interface to the high speed interconnect interface of the first field replaceable unit.

3. The method of claim 1, wherein the steps of verifying an ability of the first field replaceable unit to receive signals from the second unit of the system through its high speed interconnect interface and verifying an ability of the first field replaceable unit to transmit signals to the second unit of the system are performed by a management processor through a JTAG interface to the high speed interconnect interface of the first field replaceable unit and through a JTAG interface to a high speed interconnect interface of the second field replaceable unit.

4. The method of claim 3, wherein error correction coding of the high speed interconnect interface of the field replaceable unit is disabled during the step of verifying an ability of the first field replaceable unit to transmit signals to a second unit of the system.

5. The method of claim 1 further comprising the steps of:

inserting a daughter field replaceable unit into a connector of the first field replaceable unit, the daughter field replaceable unit having a high speed interconnect interface and a test interconnect;

verifying an ability of the first field replaceable unit to receive signals from the daughter field replaceable unit; and verifying an ability of the first field replaceable unit to transmit signals to the daughter field replaceable unit.

6. The method of claim 5, wherein the steps of verifying an ability of the first field replaceable unit to receive signals from a second unit of the system and verifying an ability of the first field replaceable unit to transmit signals to the second unit of the system are performed under control of a management processor of the system.

7. The method of claim 1, wherein the step of verifying an ability of the first field replaceable unit to receive signals from a second unit of the system through its high speed interconnect interface further comprises the step of having the second unit of the system arbitrate for a bus, the bus being coupled to the high speed interconnect interface of the first and second field replaceable units.

* * * * *